United States Patent
Chen

(10) Patent No.: US 8,981,465 B2
(45) Date of Patent: *Mar. 17, 2015

(54) TRENCH SCHOTTKY DIODE AND MANUFACTURING METHOD THEREOF

(71) Applicant: Tzu-Hsiung Chen, Taipei (TW)

(72) Inventor: Tzu-Hsiung Chen, Taipei (TW)

(73) Assignee: Tzu-Hsiung Chen, Taipei (TW)

( * ) Notice: Subject to any disclaimer, the term of this patent is extended or adjusted under 35 U.S.C. 154(b) by 93 days.

This patent is subject to a terminal disclaimer.

(21) Appl. No.: 13/691,989

(22) Filed: Dec. 3, 2012

(65) Prior Publication Data

US 2013/0140630 A1 Jun. 6, 2013

(30) Foreign Application Priority Data

Dec. 6, 2011 (TW) .............................. 100144909 A

(51) Int. Cl.
| | |
|---|---|
| *H01L 29/76* | (2006.01) |
| *H01L 29/94* | (2006.01) |
| *H01L 29/78* | (2006.01) |
| *H01L 21/28* | (2006.01) |
| *H01L 29/40* | (2006.01) |
| *H01L 29/66* | (2006.01) |
| *H01L 29/872* | (2006.01) |
| *H01L 29/06* | (2006.01) |

(52) U.S. Cl.
CPC ...... *H01L 29/7827* (2013.01); *H01L 21/28017* (2013.01); *H01L 29/407* (2013.01); *H01L 29/66143* (2013.01); *H01L 29/8725* (2013.01); *H01L 29/0661* (2013.01)
USPC .......................................... 257/330; 438/589

(58) Field of Classification Search
CPC ..... H01L 29/7827; H01L 29/78; H01L 21/28; H01L 21/28017
USPC .......................................... 257/330; 438/589
See application file for complete search history.

(56) References Cited

U.S. PATENT DOCUMENTS

| | | | |
|---|---|---|---|
| 5,365,102 A | 11/1994 | Mehrotra et al. | |
| 8,581,360 B2 * | 11/2013 | Chen | 257/471 |
| 2001/0010385 A1 * | 8/2001 | Hijzen et al. | 257/471 |

* cited by examiner

*Primary Examiner* — Theresa T Doan
(74) *Attorney, Agent, or Firm* — WPAT, PC; Justin King

(57) ABSTRACT

A trench Schottky diode and a manufacturing method thereof are provided. The manufacturing method includes the following steps. Firstly, a semiconductor substrate is provided. A multi-trench structure including a wide trench and a plurality of narrow trenches is formed in the semiconductor substrate, a gate oxide layer is formed on a surface of the multi-trench structure, and a polysilicon structure is formed over the gate oxide layer and the first oxide layer. The polysilicon structure is etched to partially expose the first oxide layer and the gate oxide layer on a bottom surface of the wide trench. The semiconductor substrate, the polysilicon structure and the gate oxide layer are partially exposed by a photolithography and etching process. A metal sputtering layer is formed. Afterwards, the metal sputtering layer is etched to expose a part of the second oxide layer.

7 Claims, 8 Drawing Sheets

US 8,981,465 B2
// 1

TRENCH SCHOTTKY DIODE AND MANUFACTURING METHOD THEREOF

This application claims the benefit of Taiwan Patent Application No. 100144909, filed Dec. 6, 2011, the subject matter of which is incorporated herein by reference.

FIELD OF THE INVENTION

The present invention relates to a trench Schottky diode, and more particularly to a trench Schottky diode with low reverse-biased leakage current, low forward voltage, high reverse voltage, and fast reverse recovery time. The present invention also relates to a method for manufacturing such a trench Schottky diode.

BACKGROUND OF THE INVENTION

A Schottky diode is a unipolar device using electrons as carriers, which is characterized by high switching speed and low forward voltage. The limitations of Schottky diodes are the relatively low reverse voltage tolerance and the relatively high reverse leakage current. The limitations are related to the Schottky barrier determined by the metal work function of the metal electrode, the band gap of the intrinsic semiconductor, the type and concentration of dopants in the semiconductor layer, and other factors. Recently, a trench-MOS Schottky barrier diode has been disclosed. In the trench-MOS Schottky barrier diode, a trench filled with polysilicon or metallic material is used for pinching the reverse-biased leakage current and thus largely reducing the leakage current of the semiconductor device.

A trench-MOS Schottky barrier diode has been disclosed in U.S. Pat. No. 5,365,102, which is entitled "SCHOTTKY BARRIER RECTIFIER WITH MOS TRENCH". Please refer to FIGS. 1A-1F, which schematically illustrate a method of manufacturing a conventional trench MOS Schottky barrier diode.

Firstly, as shown in FIG. 1A, a semiconductor substrate 12 with an epitaxial layer thickness is provided. The substrate 12 has two surfaces 12a and 12b. A heavily-doped (N+ type) cathode region 12c is adjacent to the surface 12a. A lightly-doped (N type) drift region 12d is extended from the heavily-doped (N+ type) cathode region 12c to the surface 12b. A silicon dioxide ($SiO_2$) layer 13 is grown on the substrate 12. A silicon nitride ($Si_3N_4$) layer 15 is grown on the silicon dioxide layer 13. The formation of the silicon dioxide layer 13 may reduce the stress that is provided by the silicon nitride layer 15. Moreover, a photoresist layer 17 is formed on the silicon nitride layer 15.

Then, as shown in FIG. 1B, a photolithography and etching process is performed to pattern the photoresist layer 17 and partially remove the silicon nitride layer 15, the silicon dioxide layer 13 and the substrate 12. Consequently, a plurality of discrete mesas 14 are defined in the drift region 12d of the substrate 12. In addition, the etching step defines a plurality of trenches 22. Each trench 22 has a specified depth and a specified width. Then, as shown in FIG. 10, a thermal oxide layer 16 is formed on a sidewall 22a and a bottom 22b of the trench 22. Then, as shown in FIG. 1D, the remaining silicon nitride layer 15 and the remaining silicon dioxide layer 13 are removed. Then, as shown in FIG. 1E, an anode metallization layer 23 is formed over the resulting structure of FIG. 1D. Consequently, the discrete mesas 14 are in contact with the anode metallization layer 23. Then, as shown in FIG. 1F, a metallization process is performed to form another metallization layer (not shown) on the backside surface 12a. After a sintering process is performed, a cathode metallization layer 20 is formed on the backside surface 12a. Since the anode metallization layer 23 is contacted with the mesas 14, a so-called Schottky barrier results in a Schottky contact. Meanwhile, the trench MOS Schottky barrier diode is produced.

The trench MOS Schottky barrier rectifier (TMBR) fabricated by the above method has low forward voltage. Moreover, since the reverse-biased leakage current is pinched by the trench, the leakage current is reduced when compared with the Schottky diode having no trenches. However, since the trenches are filled with the metallic material, the thermal expansion coefficient of the metallic material and the structure of the Schottky diode may result in slight variations. In the reliability test, the repeated thermal expansion and contraction processes may cause breakage of the Schottky diode. That is, the processes of creating the trenches may result in stress. If the stress is not properly adjusted, the rectifier is readily damaged during the reliability test is performed. Moreover, during operation of the rectifier, the rectifier may have malfunction because the stress may result in a tiny crack in the rectifier.

SUMMARY OF THE INVENTION

An embodiment of the present invention provides a method for manufacturing a trench Schottky diode. Firstly, a semiconductor substrate is provided. Then, a first oxide layer is formed on the semiconductor substrate. Then, the semiconductor substrate is etched according to the first oxide layer, thereby forming a multi-trench structure in the semiconductor substrate, wherein the multi-trench structure includes a wide trench at a first side of the semiconductor substrate and a plurality of narrow trenches at a second side of the semiconductor substrate. Then, a gate oxide layer is formed on a surface of the multi-trench structure. Then, a polysilicon structure is formed over the gate oxide layer and the first oxide layer. Then, the polysilicon structure is etched, so that a top surface and a part of a sidewall of the first oxide layer and a part of the gate oxide layer on a bottom surface of the wide trench are exposed. Then, a second oxide layer is formed over the polysilicon structure and the first oxide layer. Then, a photolithography and etching process is performed to partially remove the second oxide layer, so that the semiconductor substrate, the polysilicon structure and the gate oxide layer are partially exposed. Then, a metal sputtering layer is formed on the second oxide layer, the semiconductor substrate, the polysilicon structure and a part of the gate oxide layer. Afterwards, the metal sputtering layer to is etched to expose a part of the second oxide layer.

Another embodiment of the present invention provides a trench Schottky diode. The trench Schottky diode includes a semiconductor substrate, a first oxide layer, a gate oxide layer, a polysilicon structure, a second oxide layer, and a metal sputtering layer. The semiconductor substrate has a plurality of trenches, wherein the plurality of trenches includes a wide trench at a first side of the semiconductor substrate and a plurality of narrow trenches at a second side of the semiconductor substrate. The first oxide layer is formed on a surface the semiconductor substrate and located at bilateral sides of the wide trench. The gate oxide layer is formed on surfaces of the plurality of trenches and protruded over the surface the semiconductor substrate. The polysilicon structure is formed on the gate oxide layer within the narrows trenches and formed on the gate oxide layer at a sidewall and a part of a bottom surface of the wide trench, wherein the polysilicon structure is protruded over the surface the semiconductor substrate. The second oxide layer is formed on the first oxide layer, a part of the polysilicon structure and a part of the gate oxide layer. The metal sputtering layer is formed on the second oxide layer, the semiconductor substrate, the polysilicon structure and a part of the gate oxide layer.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1A:
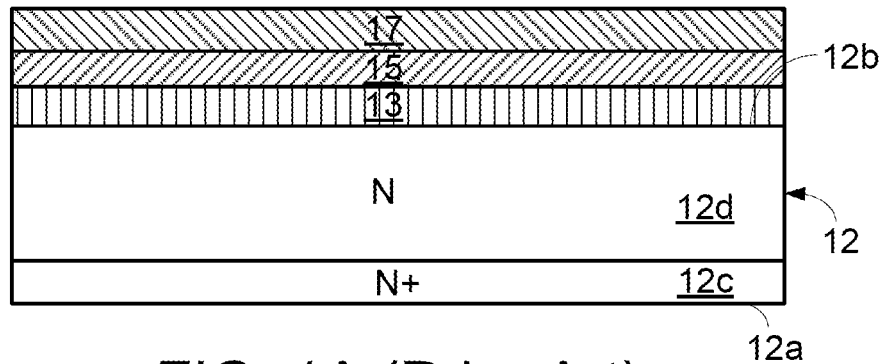
FIGS. 1A-1F (prior art) illustrate a method of manufacturing a conventional trench MOS Schottky barrier diode.
Figure 1B:
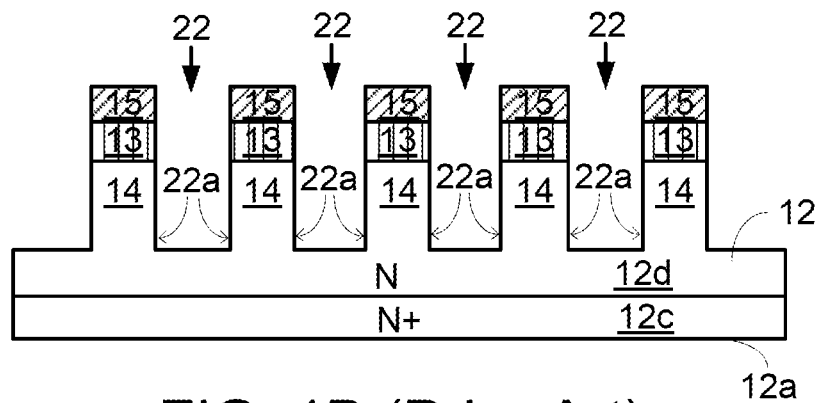
Figure 1C:
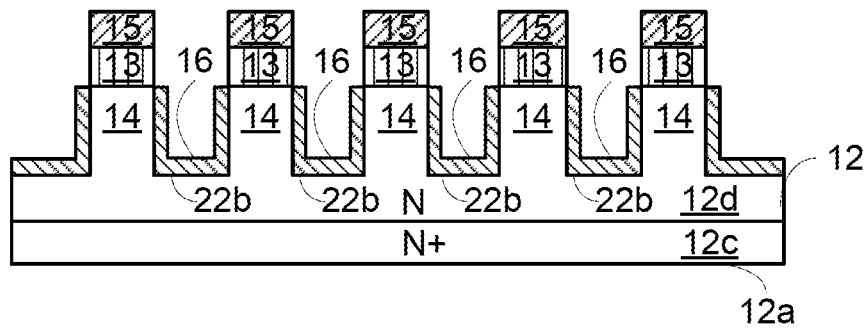
Figure 1D:
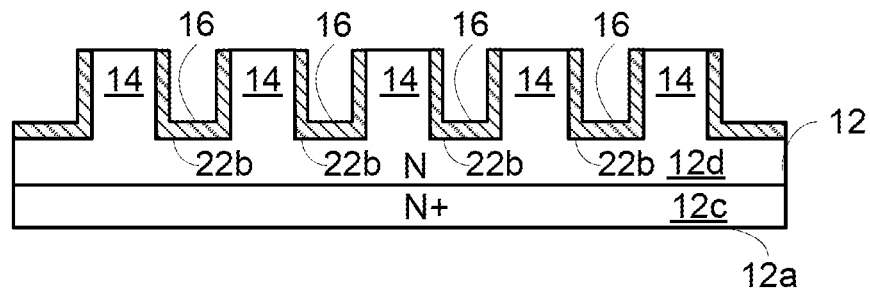
Figure 1E:
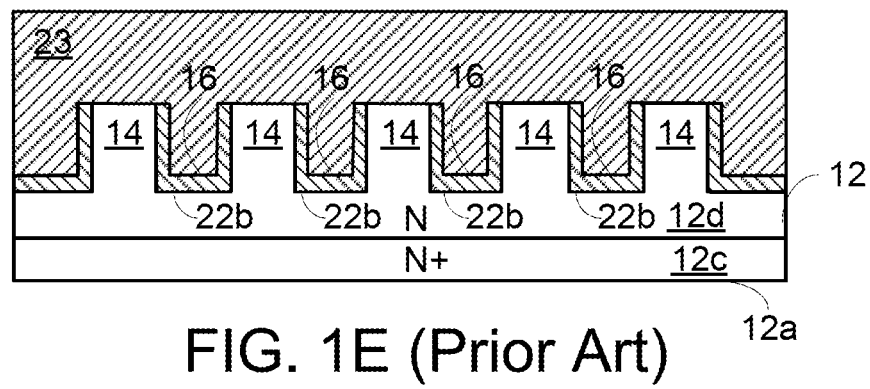
Figure 1F:
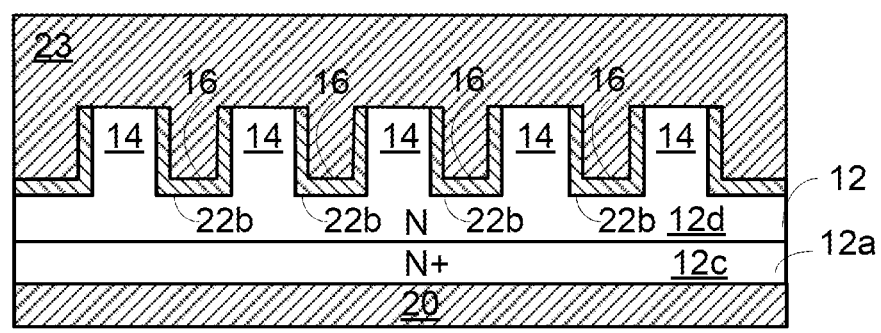
Figure 2A:
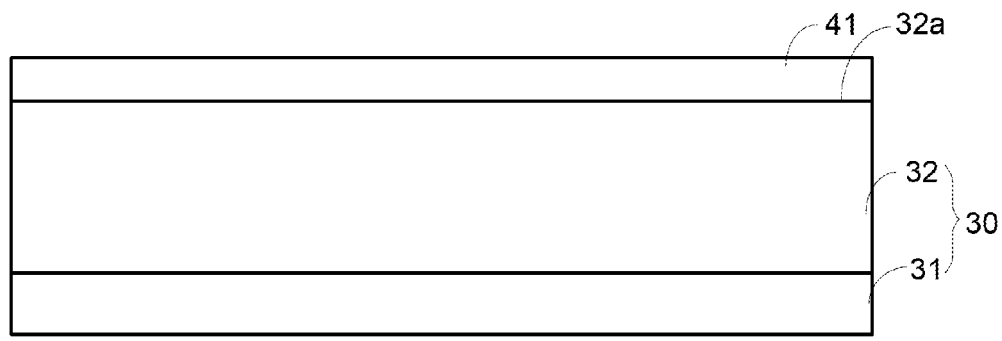
FIGS. 2A-2P schematically illustrate a method of manufacturing a trench Schottky diode according to an embodiment of the present invention.
Figure 2B:
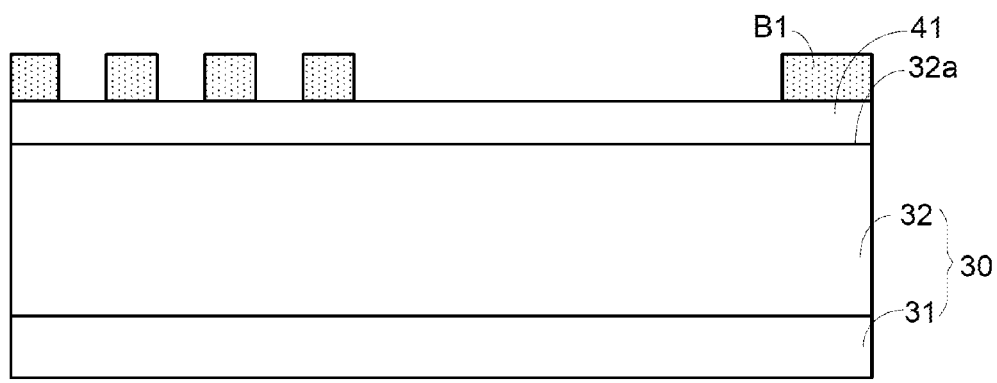
Figure 2C:
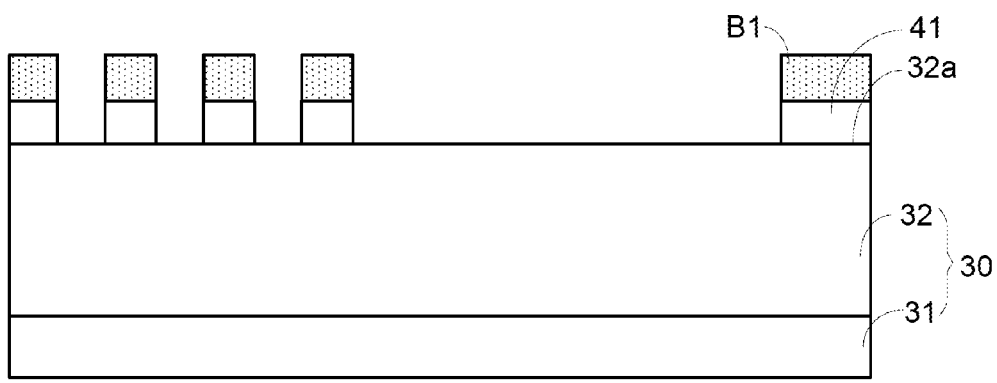
Figure 2D:
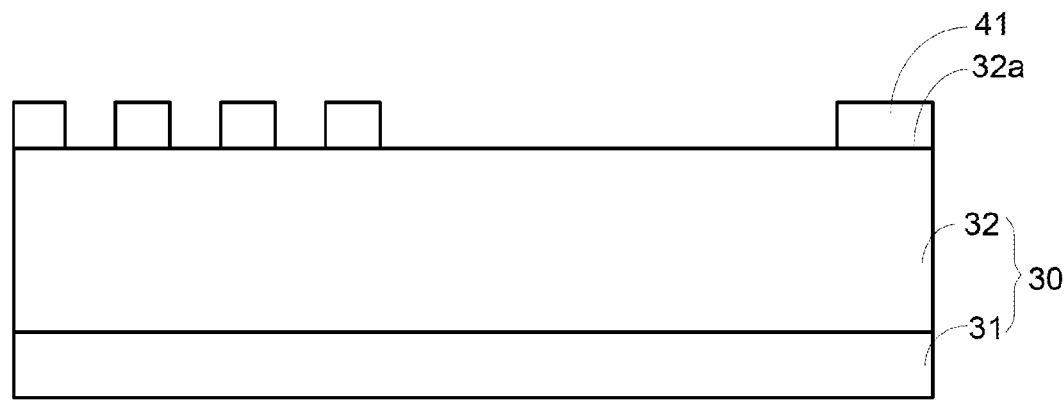
Figure 2E:
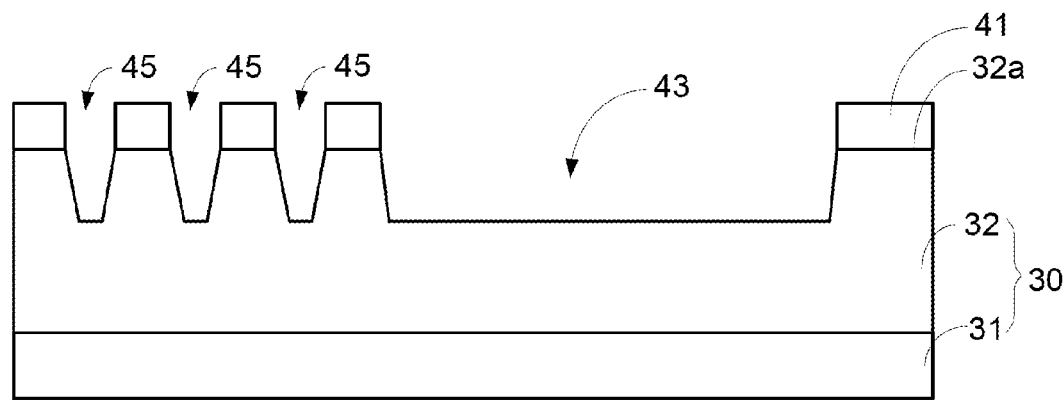
Figure 2F:
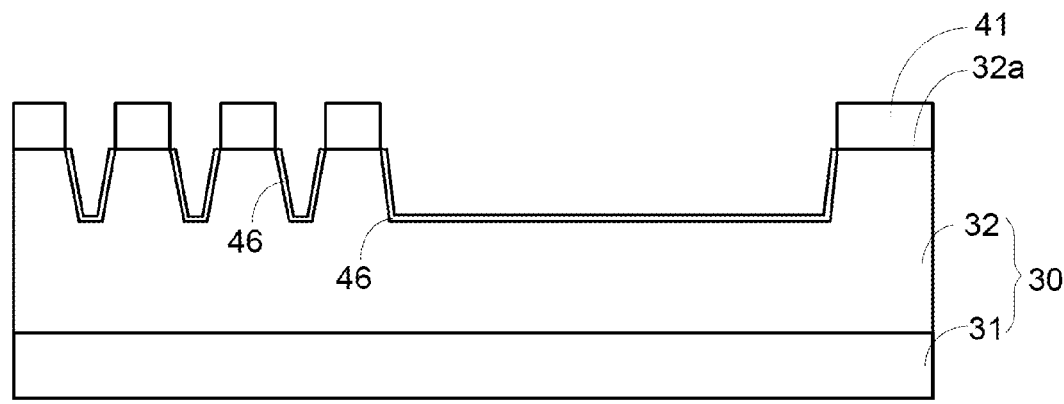
Figure 2G:
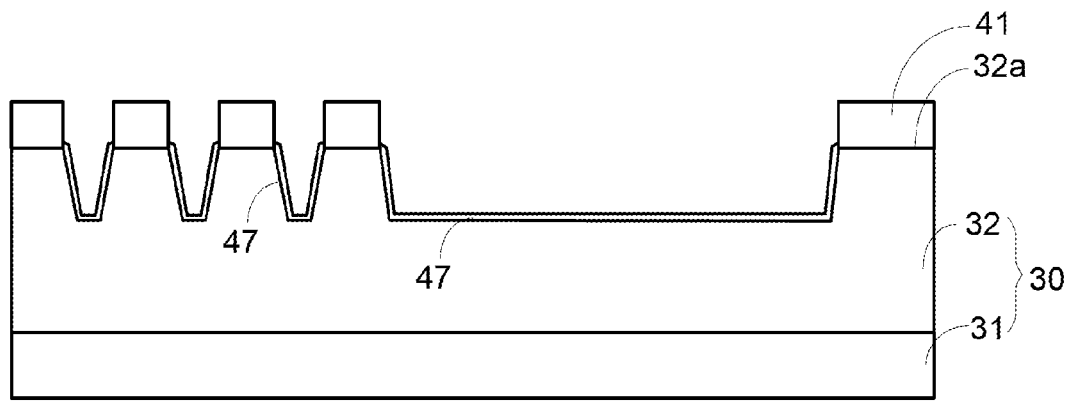
Figure 2H:
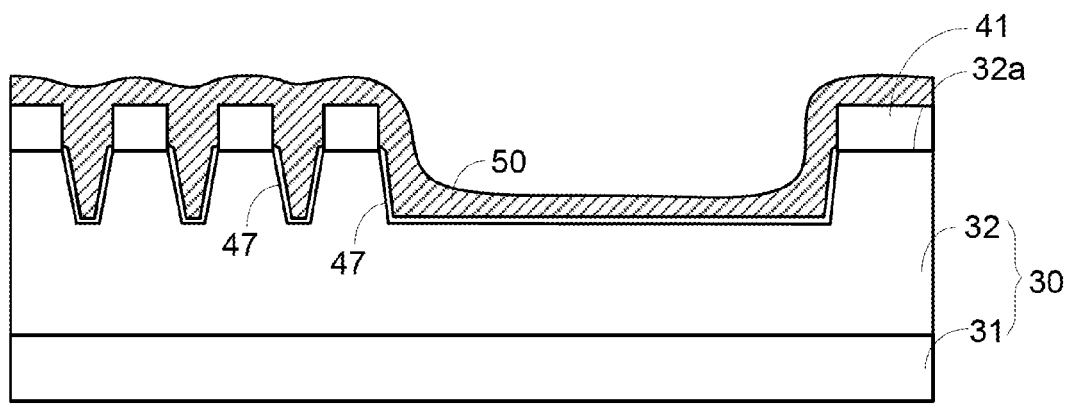
Figure 2I:
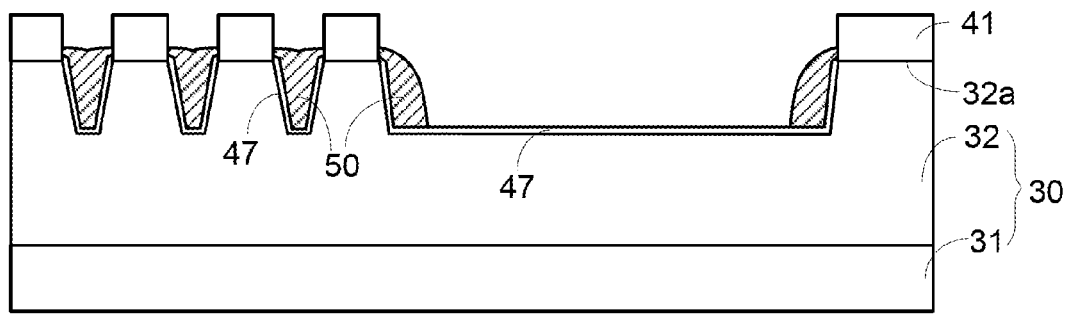
Figure 2J:
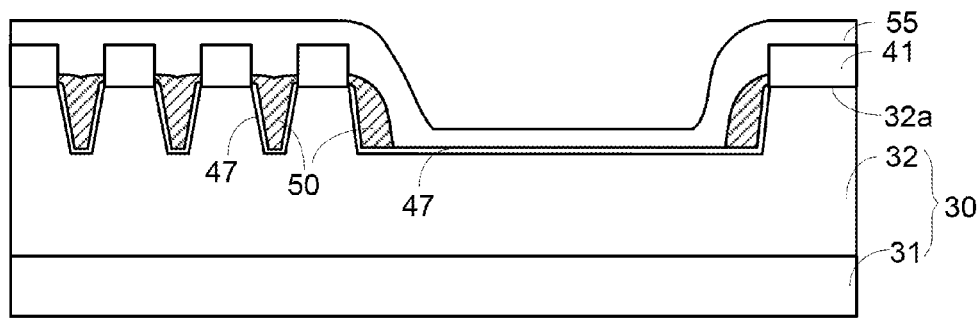
Figure 2K:
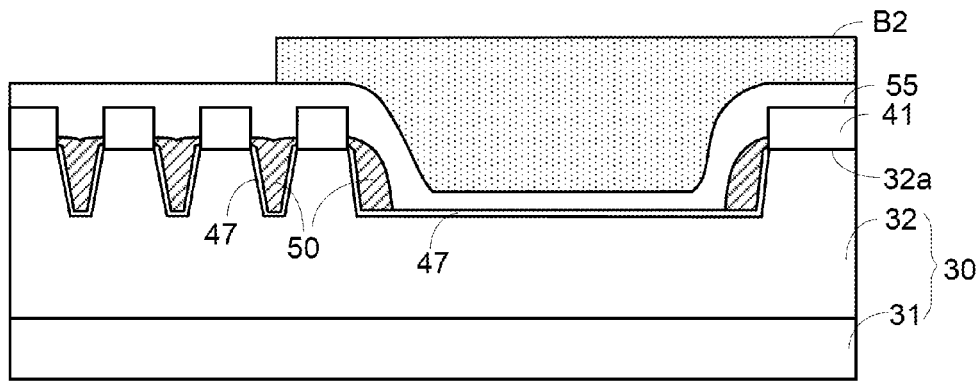
Figure 2L:
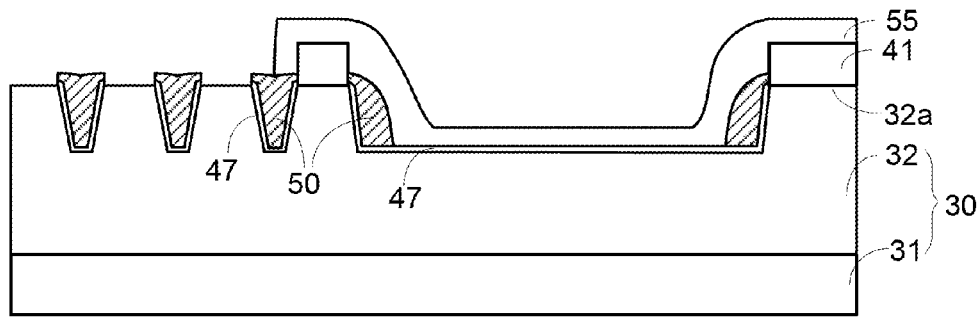
Figure 2M:
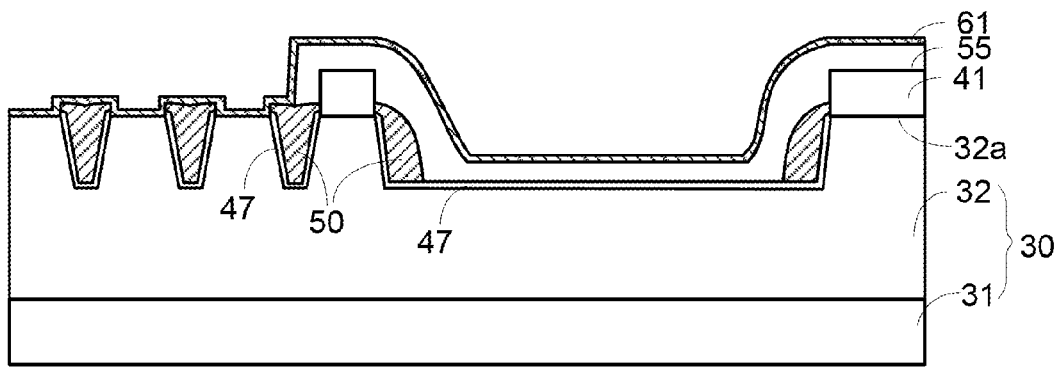
Figure 2N:
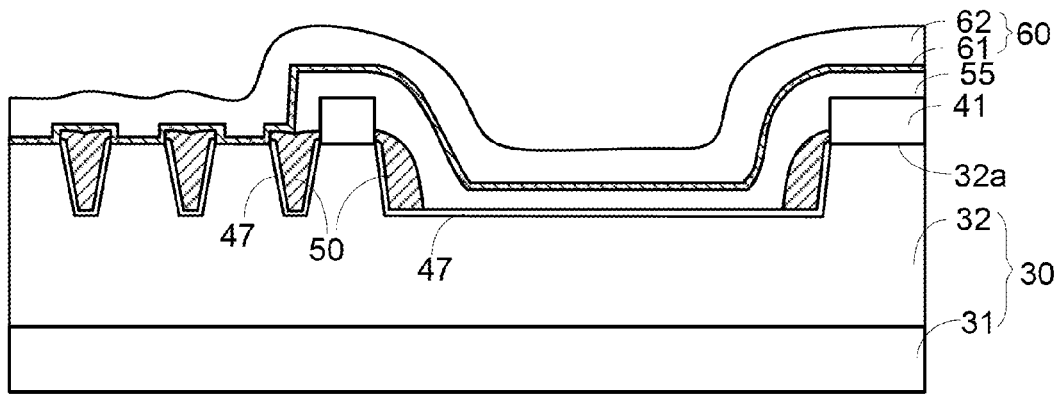
Figure 2O:
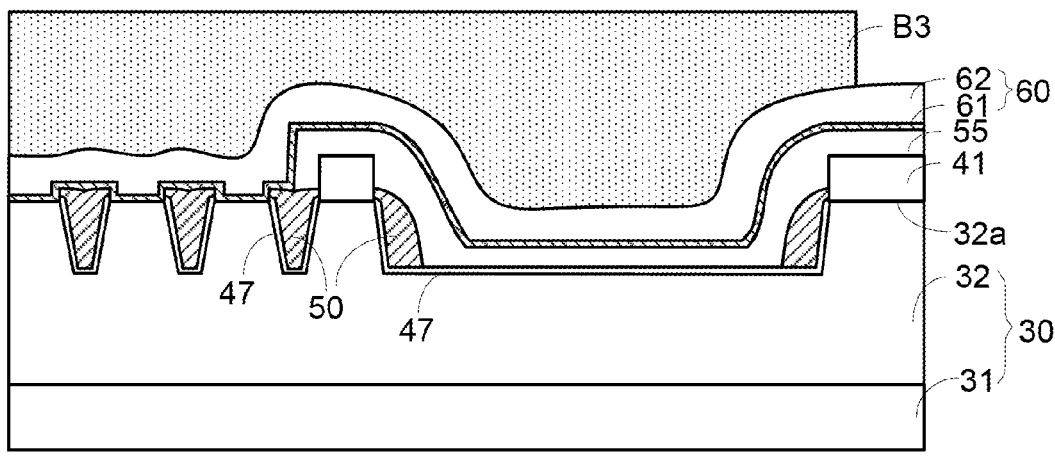
Figure 2P:
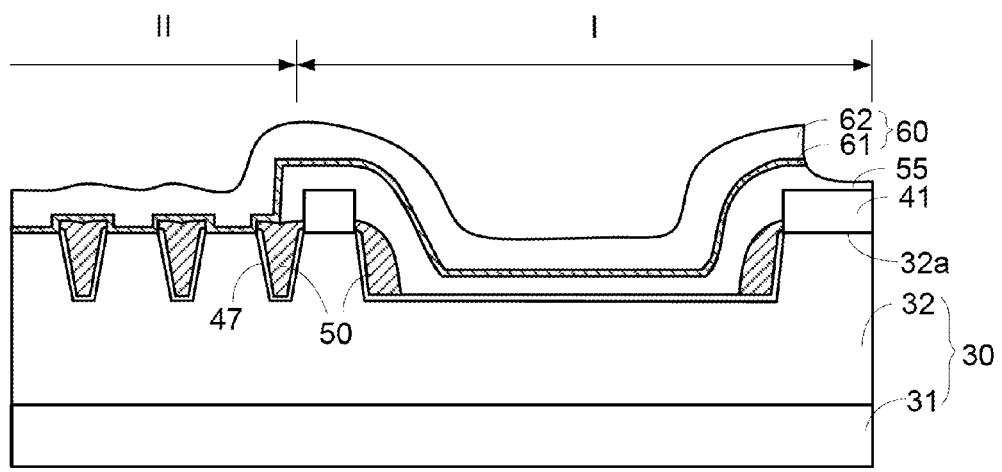

Please refer to FIGS. 2A-2P, which schematically illustrate a method of manufacturing a trench Schottky diode according to an embodiment of the present invention.

Firstly, as shown in FIG. 2A, a semiconductor substrate 30 is provided. The semiconductor substrate 30 comprises a heavily-doped (N+ type) silicon layer 31 and a lightly-doped (N type) epitaxial layer 32. The lightly-doped epitaxial layer 32 is formed on the heavily-doped silicon layer 31. Moreover, the lightly-doped epitaxial layer 32 has a specified thickness for facilitating defining a multi-trench structure in the subsequent etching process.

Then, a thermal oxidation process is performed to form a first oxide layer 41 is formed on a surface 32a of the semiconductor substrate 30 (i.e. the surface 32a of the lightly-doped epitaxial layer 32).

Then, as shown in FIG. 2B, a first photoresist layer B1 with a first photoresist pattern is formed on the first oxide layer 41. According to the first photoresist layer B1, the first oxide layer 41 is etched to have the first photoresist pattern. After the first oxide layer 41 is etched according to the first photoresist pattern, the first photoresist pattern is transferred to the first oxide layer 41. In this embodiment, the first photoresist pattern corresponds to the profile of the multi-trench structure in the subsequent etching process.

Then, as shown in FIG. 2C, the remaining first oxide layer 41 is served as a hard mask for defining the trenches. In an embodiment, the first oxide layer 41 is etched as the hard mask by a dry etching process. Then, the first photoresist layer B1 is removed, and the resulting structure is shown in FIG. 2D.

Then, as shown in FIG. 2E, by using the first oxide layer 41 as the hard mask, a trench etching process is performed to form a multi-trench structure in the semiconductor substrate 30. The multi-trench structure comprises a wide trench 43 and a plurality of narrow trenches 45. In this embodiment, the wide trench 43 is located at a first side (e.g. a right side) of the semiconductor substrate 30, and will be used as a guard ring of the trench Schottky diode. These narrow trenches 45 are located at a second side (e.g. a left side) of the semiconductor substrate 30, and will be used as a device area of the trench Schottky diode.

After the trenches 43 and 45 are formed, rough edges are possibly formed on the bottom surfaces and the sidewalls of the trenches 43 and 45. Then, a trench rounding process is performed to remove the rough edges so as to provide a better condition for the formation of associated oxide layers in the subsequent processes.

In an embodiment, the trench rounding process is carried out by performing a dry etching process at a thickness of several hundred angstroms to modify the surfaces of the trenches 43 and 45. Then, a sacrificial oxide layer 46 is formed on the surfaces (including the bottom surfaces and the sidewalls) of the trenches 43 and 45 (see FIG. 2F). The sacrificial oxide layer 46 is not too thick. By forming the sacrificial oxide layer 46 and sequentially removing the sacrificial oxide layer 46, the surfaces of the trenches 43 and 45 can be modified.

Then, the sacrificial oxide layer 46 is removed, and a gate oxide layer 47 is formed on the surfaces (including the bottom surfaces and the sidewalls) of the trenches 43 and 45 (see FIG. 2G). In this embodiment, the uppermost region of the gate oxide layer 47 is at a level higher than the surface 32a of the semiconductor substrate 30. That is, the gate oxide layer 47 on multi-trench structure is partially in contact with a sidewall of the first oxide layer 41.

After the gate oxide layer 47 is formed on the surface of the multi-trench structure, a polysilicon structure 50 is formed on the gate oxide layer 47 and the first oxide layer 41 (see FIG. 2H). In this embodiment, the polysilicon structure 50 is formed on the gate oxide layer 47 and the first oxide layer 41 by a chemical vapor deposition (CVD) process. Consequently, the spaces within the gate oxide layer 47 on the narrow trenches 45 are filled with the polysilicon structure 50. In addition, the top surface and the sidewalls of the first oxide layer 41 are covered by the gate oxide layer 47.

Then, as shown in FIG. 2I, an etch-back process is performed to remove the undesired part of the polysilicon structure 50. That is, a dry etching process is performed to uniformly and downwardly etch the polysilicon structure 50 for a preset etching time period without the need of using any photoresist pattern. After the etch-back process is done, the gate oxide layer 47 on the bottom surface of the wide trench 43 is exposed, and the top surface and a part of the sidewalls of the first oxide layer 41 are exposed. In addition, the rest of the sidewalls of the first oxide layer 41 are still in contact with the gate oxide layer 47 and the remaining polysilicon structure 50. In other words, the spaces within the gate oxide layer 47 on the narrow trenches 45 are still filled with the polysilicon structure 50. Moreover, only the sidewall and a part of the bottom surface of the wide trench 43 are covered by the polysilicon structure 50.

Then, a chemical vapor deposition (CVD) process is performed to form a borophospho-oxide layer 55 over the polysilicon structure 50 and the first oxide layer 41 (see FIG. 2J). In this embodiment, the borophospho-oxide layer 55 is made of an oxide material with impurities (e.g. boron, phosphorous), so that the melting point of the oxide material is lowered. For example, the borophospho-oxide layer is made of borophospho-tetraethoxysilane (BP-TEOS). After being heated to about 800° C., the oxide material with the boron/phosphorous impurities has soft and flowable properties. Consequently, even if the surfaces of the polysilicon structure 50 and the first oxide layer 41 are uneven, after the chemical vapor deposition (CVD) process is performed, the polysilicon structure 50 and the first oxide layer 41 can be effectively covered by the borophospho-oxide layer 55. Moreover, the borophospho-oxide layer 55 has a flat surface.

Then, as shown in FIG. 2K, a second photoresist layer B2 with a second photoresist pattern is formed on the borophospho-oxide layer 55. Then, the polysilicon structure 50 and the first oxide layer 41 uncovered by the second photoresist layer B2 are removed by a contact etching process. Then, the second photoresist layer B2 is removed. The resulting structure is shown in FIG. 2L.

By the contact etching process, all of the oxide layers (including the polysilicon structure 50 and the first oxide layer 41) uncovered by the second photoresist layer B2 are removed. Consequently, the surfaces of the semiconductor substrate 30, the polysilicon structure 50 and the gate oxide layer 47 are partially exposed. That is, the left-side area as shown in FIG. 2L is exposed.

Then, as shown in FIG. 2M, a metal sputtering process is performed to form a first metal layer 61 on the borophospho-oxide layer 55, the semiconductor substrate 30, the polysilicon structure 50 and a part of the gate oxide layer 47. Then, as shown in FIG. 2N, a second metal layer 62 is formed on the first metal layer 61. The first metal layer 61 and the second metal layer 62 are collectively defined as a metal sputtering layer 60.

In this embodiment, the metal sputtering layer 60 comprises a first metal layer 61 and a second metal layer 62. The first metal layer 61 is made of titanium (Ti). The second metal layer 62 is made of aluminum/silicon/copper (Al/Si/Cu) alloy. After the first metal layer 61 of the metal sputtering layer 60 is in contact with the surface 32a of the lightly-doped (N type) epitaxial layer 32 of the semiconductor substrate 30, a Schottky contact or a Schottky Barrier is generated. Moreover, after this step is performed, a rapid thermal processing (RTP) process is optionally performed to effectively correct a result of the metal sputtering process.

Then, as shown in FIG. 2O, a third photoresist layer B3 with a third photoresist pattern is formed on the metal sputtering layer 60. Then, the metal sputtering layer 60 uncovered by the third photoresist layer B3 (i.e. the right-side area as shown in FIG. 2O) is removed by an etching process. After the etching process is completed, the third photoresist layer B3 is removed. The resulting structure is shown in FIG. 2P.

In this step, the etching process is a metal etching process, which is used to remove the first metal layer 61 and the second metal layer 62 of the metal sputtering layer 60 uncovered by the third photoresist layer B3. Consequently, the surface of the borophospho-oxide layer 55 at the right-side area of the wafer is exposed.

Moreover, after this step, a sintering process may be optionally performed to facilitate adhesion of the metal sputtering layer 60 onto the borophospho-oxide layer 55, the semiconductor substrate 30, the polysilicon structure 50 and a part of the gate oxide layer 47. Afterwards, a wafer acceptance test (WAT) is performed to test the electrical property of the finished wafer.

The finished trench Schottky diode fabricated by the method of the present invention is shown in FIG. 2P. As shown in FIG. 2P, the trench Schottky diode comprises a semiconductor substrate 30, a first oxide layer 41, a gate oxide layer 47, a polysilicon structure 50 a borophospho-oxide layer (i.e. a second oxide layer) 55, and a metal sputtering layer 60. A multi-trench structure is formed in the semiconductor substrate 30. The multi-trench structure comprises a wide trench and a plurality of narrow trenches. The wide trench is located at a first side of the semiconductor substrate 30, and the narrow trenches are located at a second side of the semiconductor substrate 30. The first oxide layer 41 is formed on the surface 32a of the semiconductor substrate 30 and located adjacent to the wide trench. The gate oxide layer 47 is protruded over the surface 32a of the semiconductor substrate 30, and formed on the surfaces of the trenches. Similarly, the polysilicon structure 50 is protruded over the surface 32a of the semiconductor substrate 30, and formed on the gate oxide layer 47 within the narrow trenches and formed on the gate oxide layer 47 at the sidewall and a part of the bottom surface of the wide trench 43. The borophospho-oxide layer (i.e. the second oxide layer) 55 is formed on the first oxide layer 41 and a part of the polysilicon structure 50. The metal sputtering layer 60 including a first metal layer 61 and a second metal layer 62 is formed on the borophospho-oxide layer (i.e. the second oxide layer) 55, the semiconductor substrate 30, the polysilicon structure 50 and a part of the gate oxide layer 47. In addition, the surface of the borophospho-oxide layer (i.e. the second oxide layer) 55 at the right-side area of the wafer is exposed.

From the above discussions, the finished trench Schottky diode fabricated by the method of the present invention is shown in FIG. 2P. The first-side area (I) denotes a guard ring of the trench Schottky diode. The second-side area (II) denotes a device area of the trench Schottky diode.

The guard ring at the first-side area (I) is effective to block circuit and thus reduce the leakage current of the trench Schottky diode. In this embodiment, the polysilicon structure 50 and the gate oxide layer 47 are protruded over the surface 32a of the semiconductor substrate 30, so that the adhesion between the overlying metal sputtering layer 60 and the polysilicon structure 50 and the gate oxide layer 47 will be enhanced.

Moreover, a series of electrical tests demonstrate that the trench Schottky diode of the present invention has low reverse-biased leakage current, low forward voltage, high reverse voltage and fast reverse recovery time. Consequently, by the trench Schottky diode and the manufacturing method of the present invention, the problems encountered from the prior art will be obviated While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A trench Schottky diode, comprising:
   a semiconductor substrate with a plurality of trenches, wherein the plurality of trenches comprise a wide trench at a first side of the semiconductor substrate and a plurality of narrow trenches at a second side of the semiconductor substrate;
   a first oxide layer formed on a surface the semiconductor substrate and located at bilateral sides of the wide trench;
   a gate oxide layer formed on surfaces of the plurality of trenches and protruded over the surface the semiconductor substrate;
   a polysilicon structure formed on the gate oxide layer within the narrows trenches and formed on the gate oxide layer at a sidewall and a part of a bottom surface of the wide trench, wherein the polysilicon structure is protruded over the surface the semiconductor substrate;

a second oxide layer formed on the first oxide layer, a part of the polysilicon structure and a part of the gate oxide layer; and a metal sputtering layer formed on the second oxide layer, the semiconductor substrate, the polysilicon structure and a part of the gate oxide layer.

2. The trench Schottky diode as claimed in claim 1, wherein the semiconductor substrate comprises a heavily-doped (N+ type) silicon layer and a lightly-doped (N type) epitaxial layer.

3. The trench Schottky diode as claimed in claim 1, wherein the first oxide layer is produced by performing a thermal oxidation process to form a thermal oxide layer on the surface of the semiconductor substrate and etching the thermal oxide layer to form a hard mask.

4. The trench Schottky diode as claimed in claim 1, wherein the gate oxide layer is produced by etching the plurality of trenches, forming a sacrificial oxide layer on the surfaces of the trenches, removing the sacrificial oxide layer, and forming the gate oxide layer on the surfaces of the trenches.

5. The trench Schottky diode as claimed in claim 1, wherein the polysilicon structure is formed on the gate oxide layer by a chemical vapor deposition process and an etching process.

6. The trench Schottky diode as claimed in claim 1, wherein the second oxide layer is produced by performing a chemical vapor deposition process to form a borophospho-oxide layer over the polysilicon structure and the first oxide layer, and performing a contact etching process to partially remove the borophospho-oxide layer.

7. The trench Schottky diode as claimed in claim 1, wherein the metal sputtering layer comprises:

a first metal layer formed on the second oxide layer, the semiconductor layer, the polysilicon structure and a part of the gate oxide layer; and a second metal layer formed on the first metal layer, wherein the first metal layer is made of titanium, and the second metal layer is made of aluminum/silicon/copper alloy.

* * * * *